United States Patent

Shimazu et al.

(10) Patent No.: US 6,740,589 B2
(45) Date of Patent: May 25, 2004

(54) COMPOSITION FOR POLISHING SEMICONDUCTOR WAFER, SEMICONDUCTOR CIRCUIT WAFER, AND METHOD FOR PRODUCING THE SAME

(75) Inventors: Yoshitomo Shimazu, Nagano (JP); Hajime Sato, Nagano (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/996,790

(22) Filed: Nov. 30, 2001

(65) Prior Publication Data

US 2002/0098697 A1 Jul. 25, 2002

Related U.S. Application Data

(60) Provisional application No. 60/267,188, filed on Feb. 8, 2001.

(30) Foreign Application Priority Data

Nov. 30, 2000 (JP) ..................................... P2000-365429

(51) Int. Cl.$^7$ ..................... H01L 21/302; H01L 21/461

(52) U.S. Cl. ......................................... 438/691; 438/959
(58) Field of Search .................................. 438/691, 726, 438/727, 729, 730, 776, 692, 959, 963

(56) References Cited

U.S. PATENT DOCUMENTS

| 4,306,577 | A | * | 12/1981 | Wu et al. |
| 5,575,837 | A | * | 11/1996 | Kodama et al. |
| 6,139,763 | A | * | 10/2000 | Ina et al. |
| 2002/0095874 | A1 | | 7/2002 | Tsuchiya et al. |

FOREIGN PATENT DOCUMENTS

| WO | WO 99/53532 A1 | 10/1999 |
| WO | WO 01/12739 A1 | 2/2001 |

* cited by examiner

*Primary Examiner*—Phuc T. Dang
(74) *Attorney, Agent, or Firm*—Sughrue Mion, PLLC

(57) ABSTRACT

A polishing composition for polishing copper and tantalum or a tantalum compound provided on a semiconductor wafer, including an aqueous solvent and at least one amino acid having two or more nitrogen atoms.

23 Claims, No Drawings

COMPOSITION FOR POLISHING SEMICONDUCTOR WAFER, SEMICONDUCTOR CIRCUIT WAFER, AND METHOD FOR PRODUCING THE SAME

CROSS REFERENCE TO RELATED APPLICATIONS

This application is an application filed under 35 U.S.C. §111(a) claiming benefit pursuant to 35 U.S.C. §119(e)(1) of the filing date of Provisional Application no. 60/267,188 filed Feb. 8, 2001 pursuant to 35 U.S.C. §111(b).

FIELD OF THE INVENTION

The present invention relates to a chemical-mechanical polishing composition used for a production process for semiconductor devices. More particularly, the invention relates to a chemical-mechanical polishing composition which is preferably applicable to a method for polishing a composite material of a plurality of metallic species, more specifically a composite material including copper and a tantalum compound, in which the removal rate of copper desirably differs from that of the tantalum compound. The present invention also relates to a semiconductor wiring wafer produced through polishing by use of the polishing composition and to a method for producing the wafer.

BACKGROUND OF THE INVENTION

Chemical-mechanical polishing is generally considered to be an effective technique for attaining a finishing surface of high accuracy. In the field of semiconductor device manufacture, progress in integration and layer multiplication of semiconductor devices have called for solutions to a variety of requirements related to planarization, led by the issue of focal depth in photolithography. To this end, chemical-mechanical polishing has been proposed and studied.

As disclosed in, for example, Japanese Patent Publication (kokoku) No. 6-103681 and Japanese Patent Application Laid-Open (kokai) Nos. 6-13287 and 7-233485, as one mode of the chemical-mechanical polishing technique, the Damascene method is a method in which a metallic wiring material is charged into holes or trenches formed on an insulating film provided on a semiconductor wafer, and the wiring material provided above the surface of the insulating film is removed through polishing, thereby forming wiring. This method has been developed for forming wiring of copper, which has low electrical resistance and thought to be suitable as a metallic material for forming fine wiring.

Copper diffuses through the contact surface between a copper layer and an insulating film formed from, for example, silica, into the insulating film. Therefore, when the Damascene method using copper is carried out, a thin diffusion barrier layer is formed on the surface of the insulating film in order to prevent diffusion of copper into the insulating film after trenches are formed on an insulating film, and a copper layer is formed on the barrier layer. Thereafter, the copper layer and the diffusion barrier layer formed above the surface of the insulating film are removed through polishing, to form copper wiring. The diffusion barrier layer is formed from a tantalum compound such as tantalum or tantalum nitride.

In a typical chemical-mechanical polishing method, a semiconductor wafer is pressed at a certain load against a polishing pad affixed to a rotatable table, and while a polishing slurry is fed between the polishing pad and the semiconductor wafer, the table and the wafer are rotated, thereby performing polishing. A typical polishing slurry contains a solution which is chemically active to a substance to be polished, and abrasive exerting mechanical polishing effect are suspended in the solution.

In order to improve production efficiency of semiconductor devices, high removal rates of copper and a metal constituting a diffusion barrier layer are desired. However, since the hardness of the metal used in the diffusion barrier layer is higher than that of copper, difficulty is encountered in removing the metal through polishing at a high rate suitable for removing copper. When the rate of removing copper differs from that of removing the metal used in the diffusion barrier layer, a so-called dishing phenomenon occurs, in which the surface of copper that fills trenches walled by the diffusion barrier layer is depressed, inviting, for example, an increase in wiring resistance and occurrence of short circuit of wiring of upper layers, and resulting in lowering of reliability of the semiconductor device. In addition, in a region where wiring is densely provided, since the width of an insulating film or the diffusion barrier layer surrounded by wiring is narrow, the film or the layer is polished, and wiring trenches are made shallow; i.e., an erosion phenomenon arises.

Usually, a two-step polishing method is performed for polishing such a wiring layer. For example, in a first polishing step, copper is removed at a high rate, and in a second polishing step, copper, a metal used in a diffusion barrier layer, and silica are removed through polishing at substantially the same rate to form a wiring structure.

In the case of the aforementioned polishing method in which copper, the diffusion barrier layer, and an insulating film are polished at substantially the same rate in the second polishing step, a wiring structure of uniform thickness fails to be formed through polishing in the second step when the surface polished in the first step is not planar. Therefore, in the first polishing step, polishing must be stopped at the surface of the diffusion barrier layer without polishing of the metal therein to form a planar surface.

In chemical-mechanical polishing, selectivity in removal rate (i.e., ability to polish with material specificity), is generally attained by suitably selecting a chemically active component to be incorporated in a polishing slurry in chemical-mechanical polishing for forming copper wiring, a method for regulating the ratio of the removal rate of copper to that of a metal used in a diffusion barrier layer is disclosed, for example, in Japanese Patent Application Laid-Open (kokai) No. 2000-160141. JP 2000-160141 discloses a polishing composition containing α-alanine, which provides a high ratio of the removal rate of a copper film to that of a tantalum-containing compound.

As described above, in order to prevent polishing of a diffusion barrier layer and to prevent the erosion phenomenon in the first polishing step for forming copper wiring, the ratio of the removal rate of copper to that of a metal used in the diffusion barrier layer must be large, and the removal rate of the metal used in the diffusion barrier layer must be sufficiently low.

From this viewpoint, polishing of the metal used in the diffusion barrier layer at a suppressed level, which is attained by the conventional technique, is insufficient. Specifically, as described in the Examples of Japanese Patent Application Laid-Open (kokai) No. 2000-160141, the removal rate of a tantalum-containing compound becomes high in accordance with an increase in the removal rate of copper, and maintaining the removal rate of tantalum at a low level such that the erosion phenomenon can be sufficiently prevented is difficult.

In the aforementioned first polishing step, the removal rate of the insulating film must also be low. Since the thickness of a copper layer is not necessarily uniform throughout a semiconductor wafer, when copper provided on the diffusion barrier layer is removed throughout the semiconductor wafer, the copper is removed in an early stage at a region where the thickness of the copper layer is small. As a result, the diffusion barrier layer is polished for a long period of time. Therefore, even when the removal rate of the metal used in the diffusion barrier layer is reduced, the diffusion barrier layer may be removed through polishing, resulting in exposure of the insulating film. However, even in this case, erosion can be prevented by regulating the removal rate of the insulating film.

Japanese Patent Application Laid-Open (kokai) No. 10-279928 discloses potassium hydrogenphthalate serving as a compound for regulating the removal rate of an insulating film. However, the regulation effect is not sufficient for preventing erosion of the insulating film in a wiring portion of high package-density, and the effect of the compound on the removal rate of copper or a metal used in a diffusion barrier layer is not disclosed in this publication.

Japanese Patent Application Laid-Open (kokai) Nos. 2000-160138 and 2000-160140 disclose a polishing composition which attains a high removal rate of a metal and a low removal rate of an insulating film. According to these publications, the polishing composition is suitable for a polishing process in which a layer of tantalum or tantalum nitride is to be polished and an insulating film serves as a stopper. However, the polishing composition is not suitable for the case in which a diffusion barrier layer formed from tantalum or tantalum nitride serves as a stopper in a first polishing step.

SUMMARY OF THE INVENTION

In view of the foregoing, an object of the present invention is to provide a polishing composition which attains a high removal rate of copper and high operation efficiency; a low removal rate of a metal used in a diffusion barrier layer and realizes formation of a planar surface of the diffusion barrier layer; and a very low removal rate of an insulating film and does not cause wiring loss such as erosion in chemical-mechanical polishing for attaining a surface of high accuracy, particularly for forming a copper wiring layer in semiconductor device manufacture.

In order to solve the aforementioned problems, the present inventors have performed extensive studies, and have found that an amino acid having two or more nitrogen atoms in a single molecule thereof considerably suppresses, the removal rate of a tantalum compound used in a barrier layer for preventing copper diffusion and the removal rate of silicon oxide used in an insulating film, without suppressing the removal rate of copper. The present invention has been accomplished on the basis of this finding.

The present invention provides a polishing composition which attains high efficiency in operation for removing copper through polishing; realizes termination of polishing at a diffusion barrier layer and formation of a planar surface; and enables polishing without causing erosion in chemical-mechanical polishing for attaining a surface of high accuracy, particularly in chemical-mechanical polishing for forming a copper wiring layer in semiconductor device manufacture.

Accordingly, the present invention provides a composition for polishing a semiconductor wafer, a semiconductor wiring wafer produced by using the composition, and a method for producing the wafer. Embodiments of the present invention are described below.

1. A polishing composition for polishing copper and tantalum or a tantalum compound which are provided on a semiconductor wafer, characterized by comprising an aqueous solvent and at least one amino acid having two or more nitrogen atoms.
2. A polishing composition according to 1, wherein the amino acid having two or more nitrogen atoms is a compound selected from among arginine, lysine, asparagine, glutamine, glycylglycine, citrulline, azaserine, creatine, tryptophan, histidine, δ-hydroxylysine, and a salt thereof.
3. A polishing composition according to 1, wherein the amino acid having two or more nitrogen atoms is incorporated in an amount of 0.01–10 mass %.
4. A polishing composition according to 1, which further comprises at least one copper-polishing accelerator.
5. A polishing composition according to 4, wherein the copper-polishing accelerator is a substance selected from among a carboxylic acid, a sulfonic acid, a phosphonic acid, ammonia, and a salt or a derivative thereof.
6. A polishing composition according to 4 or 5, wherein the copper-polishing accelerator is a substance selected from among formic acid, acetic acid, propionic acid, butyric acid, isobutyric acid, glycolic acid, oxalic acid, malic acid, citric acid, succinic acid, succinic acid imide, N-hydroxysuccinic acid imide, lactic acid, tartaric acid; adipic acid, polyacrylic acid, benzoic acid, nicotinic acid, sulfuric acid, benzenesulfonic acid, sulfamic acid, hexametaphosphoric acid, 1-hydroxyethylidene-1,1-diphosphonic acid, ethylamine, hexamethylenetetramine, ethylenediamine, triethanolamine, tris(hydroxymethyl) aminomethane, urea, thiourea, N-methylthiourea, and a salt thereof.
7. A polishing composition according to 4, wherein the mol ratio of the copper-polishing accelerator to the amino acid having two or more nitrogen atoms is 0.1–10.
8. A polishing composition according to 1, which has a pH of 6–11.
9. A polishing composition according to 1, which further comprises at least one type of abrasive.
10. A polishing composition according to 9, wherein the type of abrasive is selected from the group consisting of silica, alumina, titania, ceria, zirconia, manganese oxide, and a mixture thereof.
11. A polishing composition according to 10, wherein the silica is colloidal silica having an average primary particle size of 10–200 nm.
12. A polishing composition according to 10, wherein the silica is fumed silica having an average primary particle size of 5–100 nm.
13. A polishing composition according to 10, wherein the alumina is fumed alumina having an average primary particle size of 10–200 nm.
14. A polishing composition according to 10, wherein the alumina is alumina which is produced through an ammonium alum method and has an average primary particle size of 10–200 nm.
15. A polishing composition according to 10, wherein the alumina is alumina which is produced through an aluminum alkoxide method and has an average primary particle size of 10–200 nm.
16. A polishing composition according to 10, wherein the alumina is alumina which is produced through an ammonium dowsonite method and has an average primary particle size of 10–200 nm.

17. A polishing composition according to 10, wherein the alumina is alumina which is produced through an ethylene chlorohydrin method and has an average primary particle size of 10–200 nm.
18. A polishing composition according to 10, wherein the titania is fumed titania having an average primary particle size of 10–200 nm.
19. A polishing composition according to 9, wherein the abrasive are incorporated in an amount of 30 mass % or less.
20. A polishing composition according to 1, which further comprises an oxidizing agent.
21. A polishing composition according to 20, wherein the oxidizing agent is hydrogen peroxide.
22. A polishing composition according to 20 or 21, wherein the oxidizing agent is incorporated in an amount of 0.1–10 mass %.
23. A semiconductor wiring wafer comprising copper wiring and a diffusion barrier layer formed from tantalum or a tantalum compound, the semiconductor wiring wafer being produced by bringing a semiconductor wafer into contact with a polishing pad, feeding a polishing composition as recited in any one of 1 through 22 between the semiconductor wafer and the polishing pad, and polishing the wafer.
24. A method for producing a semiconductor wiring wafer comprising, during the process for forming copper wiring and a diffusion barrier layer of tantalum or a tantalum compound on a semiconductor wafer, bringing the semiconductor wafer into contact with a polishing pad; feeding a polishing composition as recited in any one of 1 through 22 between the semiconductor wafer and the polishing pad; and polishing the wafer.

DETAILED DESCRIPTION OF THE INVENTION

The chemical-mechanical polishing composition of the present invention contains an aqueous solvent and an amino acid having two or more nitrogen atoms, and contains, if desired, a copper-polishing accelerator, abrasive, and an oxidizing agent. The pH of the composition is adjusted to 6 to 11.

The term "aqueous solvent" used in the polishing composition of the present invention refers to water, or a solvent mixture of water and a water-soluble solvent (e.g., alcohol), the mixture predominantly containing water, e.g., in an amount of at least 50%.

Examples of the amino acid having two or more nitrogen atoms of the present invention, include arginine, lysine, asparagine, glutamine, glycylglycine, citrulline, azaserine, creatine, tryptophan, histidine, δ-hydroxy-lysine, and salts thereof.

These amino acids are not limited to α-amino acids. As described in the Examples, the amino acid may include, in addition to an amino group, a nitrogen-atom-containing functional group such as an imino group, a carbamoyl group, or an amidino group.

The incorporation amount of the amino acid having two or more nitrogen atoms is preferably 0.01–10 mass %. When the incorporation amount is 0.01–1 mass %, the effect of suppressing polishing of a tantalum compound is enhanced, and when the incorporation amount is about 0.3 mass % or more, an additional effect of suppressing polishing of silicon oxide is also exerted. In contrast, when the incorporation amount exceeds 10 mass %, erosion of copper is accelerated, which is not preferable. In the polishing composition of the present invention, the amino acid having two or more nitrogen atoms may be used alone or in combination of two or more.

If desired, the polishing composition of the present invention can contain a polishing accelerator for copper used as a wiring material. As described below, even if the copper-polishing accelerator is a compound which accelerates the removal rate of a metal used in a diffusion barrier layer, the compound may be used.

The amino acid having two or more nitrogen atoms, which is incorporated into the polishing composition of the present invention, exerts the effect of considerably suppressing the removal rate of a tantalum compound, even when the composition also contains a compound which accelerates the removal rate of the tantalum compound. Because of this effect, the removal rate of copper can be arbitrarily determined by determining the type and amount of the copper-polishing accelerator, while the removal rate of a tantalum compound is maintained at a low level.

In the aforementioned point, the technique of the present invention greatly differs from the conventional technique in which the removal rates of copper and a metal used in a diffusion barrier layer are regulated by use of a single compound. The copper-polishing accelerator used in the present invention may be chosen arbitrarily, but from a practical viewpoint, a polishing accelerator which can attain a copper-removal rate of 1,000 Å/min or more is preferred. For example, the polishing accelerator is preferably a compound selected from among carboxylic acids, sulfonic acids, phosphonic acids, ammonia, and salts or derivatives thereof. Of these, more preferred compounds are formic acid, acetic acid, propionic acid, butyric acid, isobutyric acid, glycolic acid, oxalic acid, malic acid, citric acid, succinic acid, succinic acid imide, N-hydroxysuccinic acid imide, lactic acid, tartaric acid, adipic acid, polyacrylic acid, benzoic acid, nicotinic acid, sulfuric acid, benzenesulfonic acid, sulfamic acid, hexametaphosphoric acid, 1-hydroxyethylidene-1,1-diphosphonic acid, ethylamine, hexamethylenetetramine, ethylenediamine, triethanolamine, tris(hydroxymethyl)aminomethane, urea, thiourea, N-methylthiourea, and salts thereof, due to their property of not accelerating etching of copper.

The incorporation amount of the copper-polishing accelerator employed varies with the type of the polishing accelerator and the intended removal rate of copper. The mol ratio of the copper-polishing accelerator to the amino acid having two or more nitrogen atoms is preferably 0.1–10. When the molar ratio is less than 0.1, the effect of the copper-polishing accelerator is not easily exerted, whereas when the molar ratio exceeds 10, suppressing the removal rate of the tantalum compound sufficiently becomes difficult in the case where the copper-polishing accelerator exerts the effect of accelerating the removal rate of a tantalum compound.

The pH of the polishing composition of the present invention is preferably adjusted to 5 to 12, more preferably to 6 to 11, by use of an acid or an alkali. When the pH of the polishing composition is adjusted to 5 to 12, the amino acid having two or more nitrogen atoms exerts enhanced effect of suppressing the removal rates of a tantalum compound and silicon oxide. When the pH of the polishing composition is adjusted to 6 to 11, the effect of suppressing the removal rate of a tantalum compound can further be enhanced. No particular limitation is imposed on the acid or alkali used for adjusting the pH. Examples of the acid include inorganic acids such as hydrochloric acid, sulfuric acid, and nitric acid. Examples of the alkali include alkali metal hydroxides such as potassium hydroxide; alkali metal carbonates such as potassium carbonate; and ammonia.

The aforementioned acid or alkali may be incorporated directly into the composition, or may be incorporated into the composition in the form of a salt of the amino acid having two or more nitrogen atoms or a salt of the copper-polishing accelerator.

In the case of chemical-mechanical polishing of wiring material, the polishing composition of the present invention enables achievement of an intended removal rate merely by means of the mechanical polishing action of a polishing pad through appropriate regulation of process pressure and surface-plate rotation rate during polishing without incorporation of abrasive. However, in order to further increase the removal rate, the composition may contain abrasive. Examples of the abrasive which may incorporated into the polishing composition of the present invention include metal oxides such as silica, alumina, titania, ceria, zirconia, and manganese oxide.

Preferably, the abrasive have high purity and contains a small amount of impurities that deteriorate characteristics of a semiconductor device. Furthermore, in order to prevent generation of scratches, preferably, the size of the abrasive is small, and variation in the grain size is small.

Preferred examples of silica used as the abrasive include colloidal silica having an average particle size of 10–200 nm as measured through observation by use of a transmission electron microscope, and fumed silica having an average primary particle size of 5–100 nm as calculated on the basis of the surface area measured by means of a BET method.

Preferred examples of alumina used as the abrasive include fumed alumina having an average primary particle size of 10–200 nm as calculated by means of a BET method, alumina produced through an ammonium alum method in which alum is fired, alumina produced through an aluminum alkoxide method in which aluminum alkoxide is hydrolyzed and then fired, alumina produced through an ammonium dowsonite method in which ammonium aluminum carbonate is fired, and alumina produced through an ethylene chlorohydrin method in which ethylene chlorohydrin and sodium aluminate are reacted and then fired.

Preferred examples of titania used as the abrasive include titania having an average primary particle size of 10–200 nm as calculated by means of a BET method.

When the average size of the abrasive exceeds the aforementioned range, the abrasive grain may cause generation of scratches, whereas when the average size is below the aforementioned range, the effect of incorporation of the abrasive may fail to be exerted, which is not preferable from an economical viewpoint.

The polishing composition of the present invention can optionally contain any of the aforementioned abrasive alone or in combination if desired.

The amount of the abrasive incorporated into the polishing composition of the present invention is preferably 30 mass % or less. When the incorporation amount of the abrasive exceeds 30 mass %, handleability of the polishing composition is impaired; for example, dispersibility of the abrasive is lowered, or the viscosity of the polishing composition increases, which is not preferable.

The polishing composition of the present invention contains, if desired, an oxidizing agent. No particular limitation is imposed on the oxidizing agent incorporated into the composition, so long as the oxidizing agent is water-soluble. Examples of the oxidizing agent include hydrogen peroxide; permanganic acid compounds such as potassium permanganate; chromic acid compounds such as sodium chromate; nitric acid compounds such as nitric acid; peroxo compounds such as peroxodisulfuric acid; oxoacid compounds such as perchloric acid; transition metal salts such as potassium ferricyanide; and organic oxidizing agents such as peracetic acid. Of these, hydrogen peroxide is particularly preferred, since hydrogen peroxide does not contain a metallic component, by-products and decomposition products generated during reaction are non-toxic, and hydrogen peroxide has been used as, for example, a washing agent in the semiconductor industry. The amount of the oxidizing agent incorporated into the polishing composition of the present invention is 0.01–20 mass %, preferably 0.1–10 mass %. When the incorporation amount of the oxidizing agent is below the above range, depending on the additive incorporated in combination with the oxidizing agent, the erosion rate of copper may increase. In contrast, when the incorporation amount of the oxidizing agent exceeds the above range, the effect commensurate with the incorporation amount of the oxidizing agent is not obtained, which is not preferable from an economical viewpoint.

The polishing composition of the present invention may contain an oxidizing agent at the beginning of preparation. When an oxidizing agent, which assumes an aqueous solution form and has low stability is used, the oxidizing agent may be incorporated into the composition immediately before polishing.

The polishing composition of the present invention may further contain, if desired, an agent for preventing erosion of metal, such as benzotriazole, or an agent for preventing aggregation of abrasive, such as polyacrylic acid.

The polishing composition of the present invention may be prepared as a concentrate, and diluted upon use to attain a predetermined concentration.

The present invention will next be described in more detail by way of Examples, which should not be construed as limiting the invention thereto. Unless indicated otherwise herein, all parts, percents, ratios and the like are by weight.

EXAMPLES

Examples 1 through 25 and Comparative Examples 1 through 10

The polishing compositions of Examples 1 through 25 and Comparative Examples 1 through 10 were prepared by mixing water serving as a solvent with the below-described ingredients to attain, after addition of an oxidizing agent (hydrogen peroxide), compositional proportions shown in Table 1. L-arginine, L-lysine, L-glycylglycine, or L-citrulline were used as an amino acid having two or more nitrogen atoms (hereinafter the amino acid will be abbreviated as "amino acid"). β-alanine, 6-aminocaproic acid, L-aspartic acid, or glycine were used as a nitrogen-atom-containing comparative compound. Acetic acid, hexametaphosphoric acid, malic acid, or oxalic acid were used as a copper-polishing accelerator (hereinafter abbreviated as "polishing accelerator"). Colloidal silica (average primary particle size: 80 nm, hereinafter abbreviated as "CS"), colloidal silica (average primary particle size: 50 nm, hereinafter abbreviated as "CS2"), fumed silica (average primary particle size: 30 nm, hereinafter abbreviated as "FS"), alumina produced through an ammonium alum method (average primary particle size: 50 nm, hereinafter abbreviated as "UA"), or fumed alumina (average primary particle size: 20 nm, hereinafter abbreviated as "FA") were used as abrasive. The pH of the polishing composition was adjusted to a predetermined pH by use of aqueous ammonia or a potassium hydroxide aqueous solution. Hydrogen peroxide was used as an oxidizing agent, and was incorporated into the polishing composition in an amount of 2 mass % immediately before polishing.

Polishing performance of the polishing composition was evaluated in the following manner. The results are shown in Table 1.

Polishing Conditions
   Polishing apparatus: One-side polishing machine (Chemical-mechanical polishing machine)
   Pad: IC-1000/Suba400 (Product of Rodel Inc.)
   Rotation speed of surface-plate: 70 rpm
   Rotation speed of wafer: 70 rpm
   Down force: 300 g/cm$^2$ Work (3): 6-inch silicon wafer on which a tantalum nitride film of 4,000 Å was formed through sputtering Work (4): 6-inch silicon wafer on which a silicon dioxide film of 10,000 Å was formed through thermal oxidation Evaluation conditions The thickness of the metal (Cu, Ta, or TaN) film was determined by measuring the electrical resistance of the metal film on the silicon wafer before and after polishing to calculate the removal rate (Å/min) of the film. Meanwhile, the thickness of the silicon dioxide ($SiO_2$) film was measured using a reflection-type film-thickness measurement apparatus before and after polishing to calculate the removal rate of the film.

TABLE 1

| | Amino acid (mass %) | Polishing accelerator (mass %) | pH | Abrasive (mass %) | Removal rate (Å/min) Cu | Ta | TaN | $SiO_2$ |
|---|---|---|---|---|---|---|---|---|
| Ex. | | | | | | | | |
| 1 | L-Arginine (0.2%) | — | 10.0 | UA (4%) | 300 | 40 | 50 | 120 |
| 2 | L-Arginine (0.5%) | — | 10.0 | UA (4%) | 820 | 30 | 40 | 70 |
| 3 | L-Arginine (1.0%) | — | 10.0 | UA (4%) | 2200 | 20 | 30 | 50 |
| 4 | L-Arginine (0.2%) | Acetic acid (0.6%) | 7.0 | FS (4%) | 2010 | 130 | 160 | 170 |
| 5 | L-Arginine (0.5%) | Acetic acid (0.6%) | 7.0 | FS (4%) | 2380 | 40 | 50 | 60 |
| 6 | L-Arginine (1.0%) | Acetic acid (0.6%) | 7.0 | FS (4%) | 2660 | 30 | 40 | 30 |
| 7 | L-Lysine (1.0%) | — | 9.0 | UA (4%) | 2050 | 20 | 30 | 60 |
| 8 | L-Lysine (0.5%) | Acetic acid (0.6%) | 7.0 | FS (4%) | 3260 | 40 | 40 | 110 |
| 9 | L-Glycylglycine (0.5%) | Acetic acid (0.6%) | 7.0 | FS (4%) | 4330 | 50 | 50 | 80 |
| 10 | L-Citrulline (0.5%) | Acetic acid (0.6%) | 7.0 | FS (4%) | 2040 | 250 | 320 | 120 |
| 11 | L-Arginine (0.5%) | Hexametaphosphoric acid (1.0%) | 7.0 | CS2 (3%) | 1920 | 10 | 20 | 80 |
| 12 | L-Arginine (0.5%) | Malic acid (1.0%) | 7.0 | UA (4%) | 4650 | 20 | 20 | 30 |
| 13 | L-Lysine (0.5%) | Malic acid (1.0%) | 7.0 | UA (4%) | 4830 | 20 | 30 | 40 |
| 14 | L-Arginine (0.1%) | Oxalic acid (0.4%) | 7.0 | CS (4%) | 5490 | 520 | 600 | 190 |
| 15 | L-Arginine (0.3%) | Oxalic acid (0.4%) | 5.0 | CS (4%) | 5490 | 460 | 530 | 220 |
| 16 | L-Arginine (0.3%) | Oxalic acid (0.4%) | 6.0 | CS (4%) | 5640 | 150 | 190 | 200 |
| 17 | L-Arginine (0.3%) | Oxalic acid (0.4%) | 7.0 | CS (4%) | 5990 | 110 | 140 | 200 |
| 18 | L-Arginine (0.3%) | Oxalic acid (0.4%) | 8.0 | CS (4%) | 5190 | 60 | 80 | 170 |
| 19 | L-Arginine (0.3%) | Oxalic acid (0.4%) | 9.0 | CS (4%) | 5330 | 10 | 10 | 150 |
| 20 | L-Lysine (0.2%) | Oxalic acid (0.5%) | 9.0 | CS (2%) | 6870 | 120 | 190 | 150 |
| 21 | L-Lysine (0.2%) | Oxalic acid (0.5%) | 9.0 | CS (1%) | 6470 | 30 | 40 | 50 |
| 22 | L-Lysine (0.2%) | Oxalic acid (0.5%) | 9.0 | CS (0.5%) | 4430 | 20 | 20 | 30 |
| 23 | L-Lysine (0.2%) | Oxalic acid (0.5%) | 9.0 | CS (0.2%) | 4170 | 10 | 10 | 0 |
| 24 | L-Lysine (0.2%) | Oxalic acid (0.5%) | 9.0 | — | 3560 | 0 | 0 | 0 |
| 25 | L-Lysine (0.3%) | Malic acid (0.4%) | 9.0 | FA (4%) | 4160 | 70 | 90 | 60 |
| Comp. Ex. | | | | | | | | |
| 1 | — | — | 10.0 | CS2 (4%) | 110 | 100 | 140 | 150 |
| 2 | — | Acetic acid (0.6%) | 7.0 | FS (4%) | 470 | 1220 | 1520 | 170 |
| 3 | β-Alanine (0.2%) | Acetic acid (0.6%) | 7.0 | FS (4%) | 970 | 1160 | 1300 | 290 |
| 4 | 6-Amino-n-caproic acid (0.5%) | Acetic acid (0.6%) | 7.0 | FS (4%) | 620 | 790 | 990 | 170 |
| 5 | L-Aspartic acid (0.2%) | Acetic acid (0.6%) | 7.0 | FS (4%) | 1550 | 1160 | 1450 | 340 |
| 6 | Glycine (0.5%) | Acetic acid (0.6%) | 7.0 | FS (4%) | 6720 | 820 | 1020 | 320 |
| 7 | — | Hexametaphosphoric acid (1.0%) | 7.0 | CS2 (3%) | 1700 | 690 | 820 | 120 |
| 8 | — | Malic acid (1.0%) | 7.0 | UA (4%) | 4210 | 1240 | 1580 | 70 |
| 9 | — | Oxalic acid (0.4%) | 7.0 | CS (4%) | 5940 | 820 | 970 | 210 |
| 10 | — | Malic acid (0.4%) | 9.0 | FA (4%) | 4070 | 570 | 770 | 120 |

Abbreviation of abrasive
CS: Colloidal silica (average primary particle size: 80 nm)
CS2: Colloidal silica (average primary particle size: 50 nm)
FS: Fumed silica (average primary particle size: 30 nm)
UA: Alumina produced through ammonium alum method (average primary particle size: 50 nm)
FA: Fumed alumina (average primary particle size: 20 nm)

Polishing composition feed rate: 100 ml/min
Polishing time: 1 min
Work (1): 6-inch silicon wafer on which a copper film of 20,000 Å was formed through plating
Work (2): 6-inch silicon wafer on which a tantalum film of 4,000 Å was formed through sputtering As shown in Examples 1 through 25 and Comparative Examples 1 through 10, when the polishing composition of the present invention is employed, the removal rate of copper becomes high and the removal rates of the tantalum compound and silicon dioxide become low. In addition, the ratio of the removal rate of copper to that of the tantalum compound is controlled at an arbitrary value while the removal rate of the tantalum compound is maintained at a low level.

The present invention provides a polishing composition which attains a high removal rate of copper and high operation efficiency; and termination of polishing at the diffusion barrier layer and formation of a planar surface without causing wiring loss such as erosion, in a chemical-mechanical polishing process for forming copper wiring in manufacture of a semiconductor wiring wafer including a diffusion barrier layer formed from a tantalum compound. The invention also provides a semiconductor wiring wafer produced using the polishing composition, and a method for producing the wafer.

While the invention has been described in detail and with reference to specific embodiments thereof, it will be apparent to one skilled in the art that various changes and modifications can be made therein without departing from the spirit and scope thereof.

The application is based on Japanese Patent Application No. P2000-365429 filed Nov. 30, 2000 and on U.S. Provisional Application No. 60/267,188 filed Feb. 8, 2001, the disclosures of which are incorporated herein by reference in their entirety.

What is claimed is:

1. A polishing composition for polishing copper and tantalum or a tantalum compound provided on a semiconductor wafer, comprising an aqueous solvent, at least one amino acid having two or more nitrogen atoms and at least one copper-polishing accelerator, wherein the copper-polishing accelerator is a substance selected from the group consisting of a carboxylic acid, a sulfonic acid, a phosphonic acid, ammonia, and a salt or a derivative thereof.

2. The polishing composition according to claim 1, wherein the amino acid having two or more nitrogen atoms is a compound selected from the group consisting of arginine, lysine, asparagine, glutamine, glycylglycine, citrulline, azaserine, creatine, tryptophan, histidine, δ-hydroxy-lysine, and a salt thereof.

3. The polishing composition according to claim 1, containing the amino acid having two or more nitrogen atoms in an amount of 0.01–10 mass %.

4. A polishing composition for polishing copper and tantalum or a tantalum compound provided on a semiconductor wafer comprising an aqueous solvent, at least one amino acid having two or more nitrogen atoms and at least one copper-polishing accelerator, wherein the copper-polishing accelerator is a substance selected from the group consisting of formic acid, acetic acid, propionic acid, butyric acid, isobutyric acid, glycolic acid, oxalic acid, malic acid, citric acid, succinic acid, succinic acid imide, N-hydroxysuccinic acid imide, lactic acid, tartaric acid, adipic acid, polyacrylic acid, benzoic acid, nicotinic acid, sulfuric acid, benzenesulfonic acid, sulfamic acid, hexameta-phosphoric acid, 1-hydroxyethylidene-1,1-diphosphonic acid, ethylamine, hexamethylene-tetramine, ethylenediamine, triethanolamine, tris(hydroxymethyl) aminomethane, urea, thiourea, N-methylthiourea, and a salt thereof.

5. The polishing composition according to claim 1, wherein the copper-polishing accelerator is a substance selected from the group consisting of formic acid, acetic acid, propionic acid, butyric acid, isobutyric acid, glycolic acid, oxalic acid, malic acid, citric acid, succinic acid, succinic acid imide, N-hydroxysuccinic acid imide, lactic acid, tartaric acid, adipic acid, polyacrylic acid, benzoic acid, nicotinic acid, sulfuric acid, benzenesulfonic acid, sulfamic acid, hexametaphosphoric acid, 1-hydroxyethylidene-1,1-diphosphonic acid, ethylamine, hexamethylenetetramine, ethylenediamine, triethanolamine, tris(hydroxymethyl)aminomethane, urea, thiourea, N-methylthiourea, and a salt thereof.

6. A polishing composition for polishing copper and or a tantalum compound provided on a semiconductor wafer, comprising an aqueous solvent, at least one amino acid having two or more nitrogen atoms and at least one copper-polishing accelerator, containing the copper-polishing accelerator in amol ratio of 0.1–10 to the amino acid having two or more nitrogen atoms.

7. The polishing composition according to claim 1, containing the copper-polishing accelerator in a mol ratio of 0.1–10 to the amino acid having two or more nitrogen atoms.

8. The polishing composition according to claim 1, having a pH of 6–11.

9. The polishing composition according to claim 1, further comprising at least one kind of abrasive grain.

10. A polishing composition for polishing copper and tantalum or a tantalum compound provided on a semiconductor wafer, comprising an aqueous solvent, at least one amino acid having two or more nitrogen atoms and at least one kind of abrasive grain, wherein the abrasive grain is selected from the group consisting of silica, alumina, titania, ceria, zirconia, manganese oxide, and a mixture thereof.

11. The polishing composition according to claim 10, wherein the polishing composition contains colloidal silica having an average primary particle size of 10–200 nm.

12. The polishing composition according to claim 10, wherein the polishing composition contains fumed silica having an average primary particle size of 5–100 nm.

13. The polishing composition according to claim 10, wherein the polishing composition contains fumed alumina having an average primary particle size of 10–200 nm.

14. The polishing composition according to claim 10, wherein the polishing composition contains alumina produced by an ammonium alum method having an average primary particle size of 10–200 nm.

15. The polishing composition according to claim 10, wherein the polishing composition contains alumina produced by an aluminum alkoxide method having an average primary particle size of 10–200 nm.

16. The polishing composition according to claim 10, wherein the polishing composition contains alumina produced by an ammonium dowsonite method having an average primary particle size of 10–200 nm.

17. The polishing composition according to claim 10, wherein the polishing composition contains alumina produced by an ethylene chlorohydrin method having an average primary particle size of 10–200 nm.

18. The polishing composition according to claim 10, wherein the polishing composition contains fumed titania having an average primary particle size of 10–200 nm.

19. A polishing composition for polishing copper and tantalum or a tantalum compound provided on a semiconductor wafer, comprising an aqueous solvent, at least one amino acid having two or more nitrogen atoms and at least one kind of abrasive grain, containing the abrasive grain in an amount of 30 mass % or less.

20. The polishing composition according to claim 1, further comprising an oxidizing agent.

21. A polishing composition for polishing copper and tantalum or a tantalum compound provided on a semiconductor wafer, comprising an aqueous solvent, at least one amino acid having two or more nitrogen atoms and an oxidizing agent, wherein the oxidizing agent is hydrogen peroxide.

22. A polishing composition for polishing copper and tantalum or a tantalum compound provided on a semiconductor wafer, comprising an aqueous solvent, at least one amino acid having two or more nitrogen atoms and an oxidizing agent, and containing the oxidizing agent in an amount of 0.1–10 mass %.

23. A method for producing a semiconductor wiring wafer which comprises forming copper wiring and a diffusion barrier layer of tantalum or a tantalum compound on a semiconductor wafer, contacting the semiconductor wafer with a polishing pad; feeding a polishing composition between the semiconductor wafer and the polishing pad; and polishing the wafer, wherein said polishing composition comprises an aqueous solvent, at least one amino acid having two or more nitrogen atoms and at least one copper-polishing accelerator, wherein the copper-polishing accelerator is a substance selected from the group consisting of a carboxylic acid, a sulfonic acid, a phosphoric acid, ammonia, and a salt or a derivative thereof.

* * * * *